(12) United States Patent
Beer

(10) Patent No.: US 7,038,956 B2
(45) Date of Patent: May 2, 2006

(54) APPARATUS AND METHOD FOR READING OUT DEFECT INFORMATION ITEMS FROM AN INTEGRATED CHIP

(75) Inventor: Peter Beer, Fontainbleau (FR)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/888,649

(22) Filed: Jul. 9, 2004

(65) Prior Publication Data

US 2005/0030822 A1 Feb. 10, 2005

(30) Foreign Application Priority Data

Jul. 9, 2003 (DE) ................................ 103 31 068

(51) Int. Cl.
*G11C 29/00* (2006.01)

(52) U.S. Cl. .................. 365/201; 365/200; 365/189.04

(58) Field of Classification Search ................ 365/201, 365/200, 189.04, 189.05, 232, 225.7
See application file for complete search history.

(56) References Cited

U.S. PATENT DOCUMENTS

| | | | | |
|---|---|---|---|---|
| 5,457,656 | A | * | 10/1995 | Fu .............................. 365/200 |
| 6,115,301 | A | * | 9/2000 | Namekawa .................. 365/200 |
| 6,539,505 | B1 | * | 3/2003 | Dahn ......................... 714/718 |
| 2001/0028584 | A1 | * | 10/2001 | Nakayama et al. ......... 365/203 |
| 2004/0015757 | A1 | * | 1/2004 | Ohlhoff et al. ............. 714/719 |
| 2004/0044935 | A1 | * | 3/2004 | Vancura ...................... 714/718 |

* cited by examiner

*Primary Examiner*—Van Thu Nguyen
*Assistant Examiner*—Dang T. Nguyen
(74) *Attorney, Agent, or Firm*—Patterson & Sheridan, L.L.P.

(57) ABSTRACT

One embodiment of the invention provides a method for providing defect information from an integrated memory chip having dynamic memory cells arranged on word lines and bit lines, wherein a word line group having a number of word lines may be replaced by a redundant word line group and wherein a bit line may be replaced by a redundant bit line to replace defective memory cells, wherein test data are written to the memory cells of the memory chip for the purpose of testing the memory cells, the written data being read out and compared with the previously written test data to generate first defect information items depending on the result of the comparison, the first defect information item indicating a defect if the written test data and the read-out data are different, the memory cells along one of the bit lines being read successively, the first defect information item in each case being generated for each of the read memory cells, the first defect information items being buffer-stored during the testing of the memory cells on the word line group, a second defect information item being generated, the second defect information item indicating a defect if at least one of the first defect information items indicates a defect, the second defect information item being output after the end of the read-out of the memory cells of the word line group along the bit line.

16 Claims, 1 Drawing Sheet

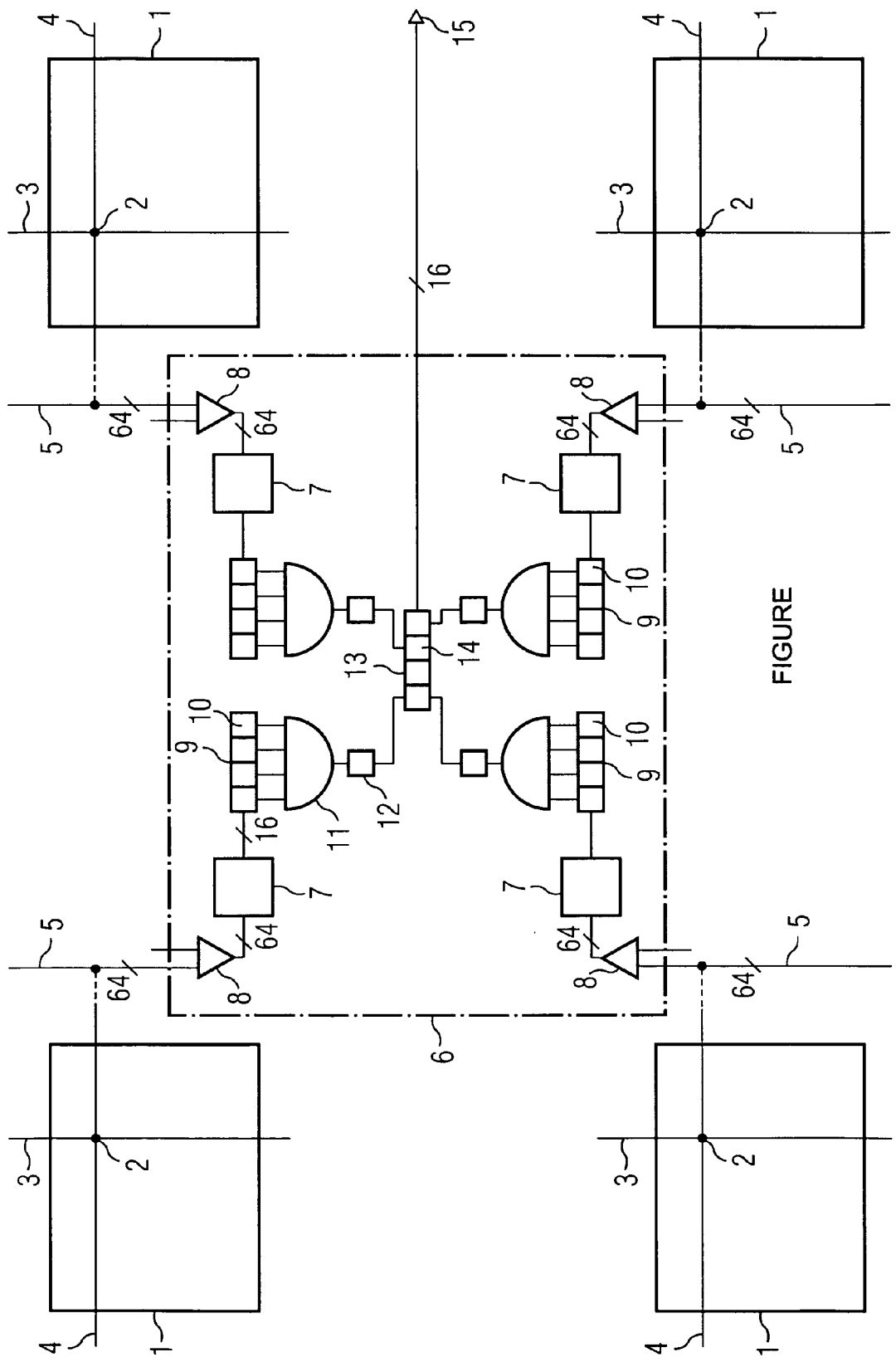
FIGURE

APPARATUS AND METHOD FOR READING OUT DEFECT INFORMATION ITEMS FROM AN INTEGRATED CHIP

CROSS-REFERENCE TO RELATED APPLICATIONS

This application claims foreign priority benefits under 35 U.S.C. §119 to co-pending German patent application number 103 31 068.1, filed Jul. 9, 2003. This related patent application is herein incorporated by reference in its entirety.

BACKGROUND OF THE INVENTION

1. Field of the Invention

The invention relates to a method for reading out defect information from an integrated memory chip. The invention furthermore relates to an integrated memory chip from which defect information items can be read out.

2. Description of the Related Art

During the fabrication of DRAM memory chips, the occurrence of defects relating to individual memory cells or groups of memory cells is virtually unavoidable. To increase the yield of usable memory chips after the production of memory chips, redundant memory cells are usually provided in the memory chip. After the fabrication of the memory chip, the entire chip, together with the redundant memory cells, is tested, and the memory cells identified as defective are replaced by redundant memory cells.

To replace the defective memory cells, the defective memory cells firstly have to be disconnected in the memory chip, and then redundant memory cells are provided at the corresponding memory address. For this purpose, fuses, i.e., programmable switches, are provided in the memory chip and can be actuated after the completion and prior to fabricating the housing of the memory chip. Laser fuses are usually used, which are severed or not severed in a corresponding laser trimming process with the aid of a laser beam. The information about which of the laser fuses is to be severed or not severed is determined on the basis of defect information items communicated from the respective chip in a test system.

The defect information items indicate the area, i.e., the address, at which a defective memory cell or a defective memory area is situated on the memory chip. The defect information items have to be transmitted from the memory chip to the test system. This transmission of the defect information items requires test time.

It is often the case that individual memory cells are not replaced by redundant memory cells. Rather, redundant memory areas having a plurality of redundant memory cells are provided, which completely replace the corresponding memory area in which a plurality of defective memory cells are present. Redundant word line groups having a plurality of word lines for the replacement of a word line group having one or a plurality of defective memory cells and redundant bit line groups having a plurality of bit lines for the replacement of a defective bit line group are usually provided for this purpose. Thus, for the repair, it is not necessary to know the specific word line from the word lines of a word line group or that the specific bit line from the bit lines of a bit line group on which the defect has occurred, since said group would be replaced by a word line group or a bit line group, respectively, anyway in the event of a defect occurring.

It is generally known to buffer-store defects identified during testing in the memory chip and to transmit them to the test system during or after testing. Since test systems have only a limited number of tester channels, the defect information items should be transmitted via the fewest possible tester channels from the memory chip to the test system, in order that as many memory chips as possible can be tested simultaneously by means of a test system.

Hitherto, a plurality of tester channels have been used for transmitting defect information items. In this case, defect information items are often already compressed internally in the memory chip such that no information required for the repair of the defective memory cells is lost. This is possible, for example, in that the memory cells located on a bit line group can be combined to form a single defect information item and be transmitted as a single defect information item to the test system. In the case of a bit line group having four bit lines, the number of tester channels required can thus be reduced by the factor 4, for example.

It is also possible to process the defect information on-chip and thus identify in the chip which elements have to be repaired. The volume of data which has to be transmitted can thus be reduced. Without increasing the transmission time, the number of channels can be reduced to a single tester channel by means of this method. However, this requires internal logic circuits by which the calculation, which would usually be carried out in the test system, is carried out on-chip. These internal logic circuits require a considerable chip area and are typically dispensed with for cost reasons.

In the context of determining defective memory cells, testing memory cells along a bit line or along a bit line group to find out whether word lines of a word line group that are to be jointly repaired have defects on the same bit line or in the same bit line group has been dispensed with hitherto for time reasons. In order to detect this by means of a simple circuit, it is necessary to effect read-out along the bit line or bit line group. This is very slow, however, since, each time an address is read out, the previous word line has to be deactivated and a new word line activated, which gives rise to a read-out pause. By contrast, reading the memory cells along a word line is fastest since, after the activation of a word line, the memory cells along the entire word line can be read without interruption. To be able to transmit defect data to the test system without relatively long pauses, the read-out of memory cells along a bit line or bit line group is therefore usually dispensed with.

SUMMARY OF THE INVENTION

It is an object of the present invention to provide an improved method and an improved integrated circuit for reading out defect information items from an integrated memory chip. It is furthermore an object of the invention to provide a method and an integrated circuit to make defect information items available to a test system in an effective manner.

A first aspect of the present invention provides a method for reading out defect information items from an integrated memory chip. The integrated memory chip has dynamic memory cells arranged on word lines and bit lines. A word line group having a number of word lines can be replaced by a redundant word line group, and/or a bit line can be replaced by a redundant bit line, in order to replace defective memory cells. Test data are written to the memory cells of the memory chip for the purpose of testing the memory cells. The written data are read out and compared with the test data to generate first defect information items depending on the result of the comparison. The first defect information item indicates a defect if the written test data and the read-out test data are different. The memory cells along one of the bit lines are read successively, the first defect information item in each case being generated for each of the read memory cells. The first defect information items are buffer-stored during the testing of the memory cells on the word line group, and a second defect information item is generated, wherein the second defect information item indicates a defect if at least one of the first defect information items indicates a defect. The second defect information items are output after the end of the read-out of the memory cells of the word line group along the bit line.

The method according to one embodiment of the invention makes it possible firstly to buffer-store the defect information items of memory cells along a bit line, which are determined by the successive activation and deactivation of word lines of a word line group, in order subsequently to be able to output a compressed defect information item to the test system. The compressed defect information item then makes it possible to ascertain more simply in the test system, i.e., with simplified calculation in the test system, whether defects on word lines of a word line group can be replaced by a common word line group.

To identify this by means of a simple circuit, the memory cells are read successively along a bit line. In order not to slow down the flow of data to the test system due to this slow type of read-out, the defect information items for the word lines of a word line group are firstly collected and are output as compressed defect information only after the determination of the individual defect information items of the memory cells along the bit lines on the word lines of the word line group. The compression is effected in that the second (compressed) defect information item indicates a defect when at least one of the first defect information items which have been determined during the read-out of the memory cells along the bit line in a word line group indicates a defect.

By virtue of the fact that the successive activation and deactivation of the word lines requires a considerable time during which relevant second defect data that are to be transmitted to the test system are not yet available, it is possible, during this time, to make the tester channel available for the transmission of other defect information items or some other information items.

By virtue of the above-mentioned procedure, the discrepancy between the time duration for transmitting the defect information and the time duration for obtaining the respective defect information is very large. Thus, the successive read-out of memory cells along a bit line on a word line group should be carried out as multiply as possible in parallel within an integrated memory chip to obtain as many first defect information items from which the second defect information items may be determined. After each complete read-out of the relevant memory cells, the second defect information items which has already been determined may be transmitted simultaneously during a next read-out of memory cells along the same bit line, another bit line and/or a further word line group.

In this respect, it may be provided, for example, that the integrated memory circuit has a plurality of memory arrays each comprising memory cells arranged on word lines and bit lines. The memory cells of the word line group in the plurality of memory arrays may be in this case read substantially simultaneously. The generation of the second defect information items is carried out for each of the plurality of memory arrays. The second defect information items may be buffer-stored and then output successively after the end of the read-out of the memory cells of the word line group along the bit line. The memory arrays are usually called memory banks and are essentially addressable by the address data independently of one another and simultaneously. As a result, it is possible to carry out the method according to one embodiment the invention simultaneously in the plurality of memory arrays, so that, as a result, second defect information items are made available for the memory cells along a bit line and on a word line group for each of the memory arrays. Thus, in the case of four memory banks as commonly provided in a memory chip, after a successive read-out of the memory cells on the word lines of a word line group in each memory bank, four second defect information items are available, which can be subsequently output to the test system at the same time as the testing of further memory cells. This makes it possible for the test time not to be increased even though memory cells along a bit line are tested successively, which usually takes place so slowly that a direct transmission of the first defect information items thereby determined would considerably lengthen the test time.

Another embodiment provides that a bit line group having a plurality of bit lines may be replaced by a redundant bit line group in order to replace defective memory cells. In the successive read-out of the memory cells on the word lines of the word line group and along the bit line group, third defect information items are generated depending on the result of the comparison for each of the corresponding memory cells, said third defect information items indicating whether a defect has occurred in one of the memory cells of the bit line group. The first defect information items are generated from the third defect information items by means of a compression, so that the first defect information item indicates a defect if one of the third defect information items indicates a defect. In this way, it is possible to achieve a further compression of the defect information items, only a defect information item obtained for a memory segment defined by the address of a word line group and the address of a bit line group being provided in order to be transmitted to the test system. In the case of word line groups having four word lines and bit line groups having four bit lines, a defect information item having the size of one bit can thus be generated for a memory segment comprising 16 memory cells, so that it is possible to achieve a compression of the defect information items by the factor 16.

A further aspect of the present invention provides an integrated memory circuit having memory cells arranged on word lines and bit lines. The memory circuit has a test circuit in order to write test data to the memory cells of the memory circuit in accordance with a test mode. The memory circuit has a redundant word line group in order to replace a word line group having a number of word lines in the case of a defect. The memory circuit furthermore has a redundant bit line in order to replace a bit line in the case of a defect. With the aid of a write circuit, test data made available for testing the memory cells are written to the memory cells of the memory circuit. A read-out circuit is provided to read out the written data. With the aid of a comparator circuit, the read-out data are compared with the read-out test data to generate first defect information items depending on the result of the comparison. The first defect information item indicates a defect if the written test data and the read-out data are different. The test circuit is provided in such a way as to successively read the memory cells in a word line group and along the bit line and in such a way as to assign one of the first defect information items to each of the read memory cells. The first defect information items determined are buffer-stored in a buffer storage. The test circuit is furthermore configured in such a way as to generate a second defect information item to be outputted. The second defect information item indicates a defect if at least one of the first defect information items of the word line group indicates a defect.

In this way, it is possible to provide an integrated memory circuit which makes it possible to successively test memory cells along a bit line and to provide a compressed defect information item which indicates whether the memory cells on a word line group or along a bit line are defective. The compression effected in the integrated memory circuit makes it possible to utilize the time of reading the memory cells on the word line group and along the bit line to communicate defect information items which have already been determined or other information items to the test system via the tester channel. Consequently, time is saved in the test system calculations since a determination as to whether a defect has occurred in a memory area defined by a word line group and a bit line and whether to replace the corresponding word line group by a redundant word line group in the case of a defect can be obviated or considerably simplified.

The memory circuit may have a plurality of memory arrays in which memory cells can be addressed simultaneously with the aid of a common address. The test circuit may be configured in such a way as to activate the memory arrays substantially simultaneously so that second defect information items are provided substantially simultaneously in each of the memory arrays. For this purpose, the test circuit has a further buffer storage to buffer-store the second defect information items of the plurality of memory arrays. The test circuit may be configured in such a way as to successively read out the second defect information items after the end of the read-out of the memory cells of the word line group along the bit line. In this way, second defect information items may be determined in parallel for the memory arrays, and may be output to the test system while defect information items are determined for a further word line group.

The memory circuit may be configured in such a way that a bit line group having a plurality of bit lines is replaced by a redundant bit line group. The test circuit generates the first defect information item for each of the word line groups, the first defect information item indicating a defect if at least one of the third defect information items indicates a defect. The third defect information items correspond to the results of the comparisons of the contents of the memory cells on the bit line group and on the respective word line with the test data written in.

BRIEF DESCRIPTION OF THE DRAWINGS

A preferred embodiment of the invention is explained in more detail below with reference to the accompanying drawings, in which:

The FIGURE shows an integrated memory circuit according to one embodiment of the invention.

DETAILED DESCRIPTION OF THE PREFERRED EMBODIMENT

The FIGURE schematically illustrates an integrated memory circuit having four memory banks 1. In the memory banks 1, memory cells 2 are in each case arranged on word lines 3 and bit lines 4. For the sake of clarity, the FIGURE illustrates in each case only one word line and one bit line, at the crossover points of which the memory cell is situated. In reality, there are a larger number of word lines and bit lines present in the memory banks.

The bit lines 4 are connected via suitable sense amplifiers (not shown), secondary sense amplifiers (not shown) and switching devices (not shown) to a data bus 5, via which data can be read out or data can be written. The data bus 5 may have, for example, a width of 64 bits, so that 64 bits of data can be read out or written in parallel.

When the memory circuit is being operated in a test mode, the data buses for each of the memory banks 1 are connected to a test circuit 6. The test circuit 6 is activated when the integrated memory circuit is in a test mode. The test circuit 6 is generally not used in normal operation of the memory circuit.

The test circuit 6 includes a compression unit 7 for each of the memory banks 1, said compression unit being connected to the data bus 5. During testing of the memory cells, on the relevant data bus 5, the data read out from the memory cells are in each case fed to a comparator unit 8, which compares the read-out data with the data previously written in. The output of the comparator device 8 is connected to the compression unit 7. The defect information item which indicates which of the read memory cells does not have the test datum written in previously and is consequently defective is present at the output of the comparator device 8.

The memory cells are not usually replaced individually by redundant memory cells. Instead, memory segments in which at least one defective memory cell is situated are replaced by a corresponding redundant memory segment. By way of example, if a memory cell on a specific word line and on a specific bit line is defective, then this memory cell can be repaired by replacement with a redundant word line or by replacement with a redundant bit line. Usually, a plurality of word lines combined to form a word line group are replaced by a redundant word line group, and a plurality of bit lines combined to form a bit line group are replaced by a redundant bit line group. When reading out data along a word line, the memory cells on bit lines from a plurality of bit line groups are usually read. Since it is not necessary to transmit the defect information for each of the read memory cells to the test system, it is already possible to determine internally in the integrated memory circuit whether a defect has occurred in a memory cell of a bit line group which has just been read. Since it is not necessary to know the position within the bit line group at which the defect occurred, the defect information items of the memory cells of a bit line group on a word line can be combined to form a signal defect information item in that the defect information item indicates a defect if one of the memory cells of the bit line group on a word line is defective. It is thereby possible to achieve a compression of the defect data by a factor which results from the size of a bit line group. This is carried out by the compression unit 7. The compression unit 7 compresses the defect information items thus determined by a factor which results from the number of bit lines to be repaired simultaneously.

These defect information items may be transmitted directly to the test system. The test system may store the defect information items thus determined and then determine how the defects found are to be replaced. The transmission of said defect information items to the test system is time-consuming, and the calculation of a suitable repair solution for repairing the defective memory cell also requires time.

One embodiment of the invention provides for memory cells on word lines combined to form word line groups to be read successively and for the second defect information items thus determined firstly to be buffer-stored in a respective buffer storage 9 for the memory banks 1. The buffer storage 9 may be formed as a shift register having a number of register elements 10, the register elements 10 in each case having a width of 16 bits. The width of 16 bits results from the width of the second defect information item. The number of register elements 10 is determined by the number of word lines of a word line group. In the example as illustrated in the FIGURE, the word line group comprises four word lines.

The four register elements 10 of the shift register 9 are filled during the successive read-out of the memory cells on the word lines of the relevant word line group. The outputs of the register elements 10 are in each case connected to an AND gate 11. On account of the width of the defect information item of 16 bits, sixteen (16) AND gates 11 are provided for each memory bank 1.

Once the data from the last word line of the word line group have been read out and the corresponding defect information item is present in the shift register, corresponding second defect information items are present at the AND gates 11, and can be accepted into a latch 12. Consequently, defect information items which indicate whether a defect has occurred in the relevant word line group can be read out in the latch 12, which likewise has a width of 16 bits.

Ultimately, defects in the respective memory bank 1 are identified by the second defect information items, in each case only one defect datum being made available for a memory segment which is addressable via a word line group and a bit line group. In the present case, a compression factor of 16 is achieved since a memory segment defined by four bit lines and four word lines, e.g., a memory segment having 16 memory cells, can be identified by a respective defect information item as free of defects or beset by defects.

Since the successive activation of the word lines for reading the memory cells takes considerably longer than reading the memory cells on an entire word line, the corresponding defect information items can, in this way, be made available significantly more slowly than is the case when simultaneously reading all the memory cells along a word line. In order nevertheless to provide a sufficient number of defect information items which can be transmitted to the test system in a consecutive sequence, the reading of memory cells along a bit line or along a bit line group is carried out simultaneously for a plurality of memory banks.

In the example illustrated, all four memory banks 1 are addressed by the common address and, via the corresponding comparator device 8, the corresponding compression unit 7, the corresponding shift register 9 and the corresponding AND gate 11, made available to the corresponding latch 12 for the purpose of providing the second defect information items.

The latches 12 are connected by their outputs to a further shift register 13, the further shift register 13 comprising a further number of further register elements 14. The further number of further register elements 14 is determined by the number of memory banks 1, e.g., four in the case of the example illustrated. After the read-out of the memory cells on the word lines of the word line group and along a bit line group, the defect information items for the tested memory segments in the simultaneously tested memory banks 1 are available at the outputs of the latches 12. Said defect information items are written to the further register elements 14 of the further shift register 13. If the memory cells on the word lines of the word line group have been read and the corresponding second defect information item has been generated, then the testing of memory cells on the word lines of a further word line group is continued in the manner described above. While the memory cells on the further word line group are tested, the defect data stored in the further shift register 13 are output to the test system (not shown) via an output 15.

In the case of a double data rate 11 memory chip, in particular, four accesses to word lines may require 28 clock cycles internally. Since 16 bit defect information items are made available by each memory bank 1, a parallel processing of two memory banks would be optimal, thereby obtaining 32 bit defect information items which are required during the 28 clock cycles for the accesses to the four word lines of a further word line group. The 32 defect information items can then be transmitted to the test system via a single tester channel during 32 clock cycles. As a result, it is possible to achieve an uninterrupted defect information flow with an internal 16-fold defect compression.

Embodiments of the invention provide a defect information item for the test system which indicates whether, along a bit line group, a defect has occurred in a memory cell in a word line group, to save time in the calculation of the repair solution in the connected test system. In one embodiment, this can be achieved in conjunction with a small additional circuitry outlay, provided that the memory cells along the same bit line group are read successively and the word lines of the word line group being activated successively.

Since addressing memory cells on different word lines requires a significantly longer time than addressing memory cells along one word line, it is the case that in particular after the compression of the defect information items, fewer defect information items are available for transmission to the test system than in the time which could be transmitted for reading the memory cells along a bit line group. Therefore, the method according to embodiments of the invention may take place simultaneously in a plurality of memory banks 1, so that defect information items may be made available generally simultaneously from the plurality of simultaneously tested memory banks 1. Said defect information items can then be buffer-stored in the further shift register 13 and be output during the testing of memory cells in a further memory segment.

The defect information items can be output via one tester channel or a plurality of tester channels, depending on a ratio between the test time of an individual memory chip and the number of memory chips to be tested simultaneously at a test system.

What is claimed is:

1. A method for providing defect information from an integrated memory circuit having memory cells arranged on word lines and bit lines, comprising:
   writing test data to the memory cells of the memory chip;
   successively reading out the written test data from the memory cells of a word line group along one of the bit lines;
   comparing the read-out data and the test data to generate a plurality of first defect information items for the memory cells of the word line group along one of the bit lines, wherein each first defect information item indicates a defect for a particular memory cell if the test data and the read-out data are different for the particular memory cell;
   buffer-storing the plurality of first defect information items;

generating a second defect information item, wherein the second defect information item indicates a defect when at least one of the first defect information items indicates a defect; and providing the second defect information item as an output of the integrated memory circuit, wherein the integrated memory circuit comprises a plurality of memory arrays each comprising a plurality of memory cells arranged on word lines and bit lines, and wherein respective second defect information items are generated for each memory array substantially simultaneously, and wherein corresponding memory cells in the plurality of memory arrays are read substantially simultaneously.

2. The method of claim 1, wherein the first defect information items are generated and buffer stored successively for the memory cells along one of the bit lines.

3. The method of claim 2, wherein the second defect information item is outputted while the memory cells of a further word line group are being tested for defects.

4. The method of claim 1, wherein each of the word lines of the word line group is activated for the successive read-out of respective memory cells and subsequently deactivated.

5. The method of claim 1, wherein the second defect information items for the memory arrays are buffer-stored and then outputted successively after the memory cells of the word line group along the bit line have been read.

6. The method of claim 5, wherein the second defect information items are outputted while the memory cells of a further word line group from the memory arrays are being tested for defects.

7. The method of claim 1, wherein a redundant bit line is utilized to replace a bit line having a defective memory cell as determined by the second defective information item.

8. The method of claim 1, wherein a redundant bit line group is utilized to replace a bit line group comprising a plurality of bit lines having one or more defective memory cells.

9. The method of claim 8, further comprising:
generating third defect information items during the successive read-out of the memory cells on the word lines of the word line group and in successive bit lines of the bit line group, wherein the third defect information items indicates whether one of the memory cells in the bit line group is defective; and
wherein the first defect information items are generated based on the third defect information items such that the first defect information item indicates a defect if one of the third defect information items indicates a defect.

10. An integrated memory circuit, comprising:
a plurality of memory cells arranged on word lines and bit lines;
a redundant word line group for replacing a word line group having a number of word lines;
a redundant bit line for replacing a bit line having one or more defective memory cells;
a write circuit for writing test data to the memory cells;
a read-out circuit for reading out the written test data from the memory cells;
a comparator circuit for comparing the read-cut data with the written test data to generate first defect information items, the first defect information item indicating a defect if the written test data and the read-out data are different; and a test circuit for conducting memory cell tests in a test mode, wherein the test circuit is configured to successively read the memory cells in word line group along the bit line, assign one of the first defect information items to each memory cell, buffer-store the first defect information items in a buffer storage, generate a second defect information item to indicate a defect when at least one of the first defect information items of the word line group indicates a defect and provide the second defect information item as an output;
wherein the memory circuit comprises a plurality of memory arrays having the memory cells, the test circuit being configured to test corresponding memory areas of each memory array substantially simultaneously and to provide respective second defect information items for each memory array.

11. The integrated memory circuit of claim 10, wherein the test circuit includes a further buffer storage for buffer-storing the second defect information items for each memory array.

12. The integrated memory circuit of claim 11, wherein the test circuit is configured to successively output the second defect information items after the memory cells of the word line group along the bit line have been read.

13. The integrated memory circuit of claim 10, further comprising:
a redundant bit line group for replacing a bit line group comprising a plurality of bit lines having one or more defective memory cells.

14. The integrated memory circuit of claim 13, wherein the test circuit is configured to generate third defect information items during the successive read-out of the memory cells on the word lines of the word line group and in successive bit lines of the bit line group, wherein the third defect information items indicates whether one of the memory cells in the bit line group is defective, and wherein the first defect information items are generated based on the third defect information items such that the first defect information item indicates a defect if one of the third defect information items indicates a defect.

15. A method for providing defect information from an integrated memory circuit having memory cells arranged on word lines and bit lines, comprising:
determining successively whether each memory cell of a word line group along a first bit line is defective;
generating a first defect information item for each memory cell;
buffer-storing the first defect information items;
generating a second defect information item, wherein the second defect information item indicates a defect when at least one of the first defect information items indicates a defect; and
providing the second defect information item as an output of the integrated memory circuit, wherein the integrated memory circuit comprises a plurality of memory arrays each comprising a plurality of memory cells arranged on word lines and bit lines, wherein the second defect information items are generated for the memory arrays substantially simultaneously, and wherein the second defect information items for the memory arrays are buffer-stored and then outputted successively after the memory cells of the word line group along the bit line have been processed.

16. The method of claim 15, further comprising:
determining whether each memory cell of the word line group along one or more other bit lines of a bit line group is defective;

generating third defect information items based on whether at least one of the memory cells in the bit line group is defective; and wherein the first defect information items are generated based on the third defect information items such that the first defect information item indicates a defect when at least one of the third defect information items indicates a defect.

* * * * *

UNITED STATES PATENT AND TRADEMARK OFFICE
CERTIFICATE OF CORRECTION

| | | |
|---|---|---|
| PATENT NO. | : 7,038,956 B2 | Page 1 of 1 |
| APPLICATION NO. | : 10/888649 | |
| DATED | : May 2, 2006 | |
| INVENTOR(S) | : Peter Beer | |

It is certified that error appears in the above-identified patent and that said Letters Patent is hereby corrected as shown below:

In Column 8, Line 8, replace "data rate 11" with -- data rate II --.

In Claim 10, at Column 9, Line 63, replace "read-cut" with -- read-out --.

Signed and Sealed this

Fifth Day of June, 2007

JON W. DUDAS
*Director of the United States Patent and Trademark Office*